US012782808B2

(12) United States Patent
Chen et al.

(10) Patent No.: US 12,782,808 B2
(45) Date of Patent: Nov. 3, 2026

(54) CHEMICAL COMPOSITION FOR TRI-LAYER REMOVAL

(71) Applicant: Taiwan Semiconductor Manufacturing Co., Ltd., Hsinchu (TW)

(72) Inventors: Li-Min Chen, Zhubei City (TW); Kuo Bin Huang, Jhubei City (TW); Neng-Jye Yang, Hsinchu (TW); Chia-Wei Wu, Miaoli County (TW); Jian-Jou Lian, Tainan City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 1011 days.

(21) Appl. No.: 17/809,912

(22) Filed: Jun. 30, 2022

(65) Prior Publication Data

US 2022/0334473 A1 Oct. 20, 2022

Related U.S. Application Data

(63) Continuation of application No. 17/007,733, filed on Aug. 31, 2020, now Pat. No. 11,378,882, which is a (Continued)

(51) Int. Cl.
*H10P 50/28* (2026.01)
*G03F 1/80* (2012.01)
(Continued)

(52) U.S. Cl.
CPC .............. *G03F 7/0035* (2013.01); *G03F 1/80* (2013.01); *G03F 7/0002* (2013.01);
(Continued)

(58) Field of Classification Search
CPC ......... H01L 21/31111; H01L 21/30604; H10P 50/28
See application file for complete search history.

(56) References Cited

U.S. PATENT DOCUMENTS 6,303,733 B1 10/2001 Lau et al.
6,503,633 B2 1/2003 Nishikawa et al.
(Continued)

FOREIGN PATENT DOCUMENTS

CN 1938412 A 3/2007
CN 101187789 A 5/2008
(Continued)

OTHER PUBLICATIONS

Krouse, et al., "Fluorotrimethylsilane Affinities of Anionic Nucleophiles: A Study of Fluoride-Induced Desilylation," American Society for Mass Spectrometry, vol. 16, Jan. 13, 2005, pp. 697-707.

*Primary Examiner* — Thomas T Pham
(74) *Attorney, Agent, or Firm* — Slater Matsil, LLP

(57) ABSTRACT

A method includes forming a tri-layer. The tri-layer includes a bottom layer; a middle layer over the bottom layer; and a top layer over the middle layer. The top layer includes a photo resist. The method further includes removing the top layer; and removing the middle layer using a chemical solution. The chemical solution is free from potassium hydroxide (KOH), and includes at least one of a quaternary ammonium hydroxide and a quaternary ammonium fluoride.

20 Claims, 19 Drawing Sheets

Related U.S. Application Data continuation of application No. 15/723,875, filed on Oct. 3, 2017, now Pat. No. 10,761,423.

(60) Provisional application No. 62/551,985, filed on Aug. 30, 2017.

(51) Int. Cl.

| | |
|---|---|
| ***G03F 7/00*** | (2006.01) |
| ***G03F 7/075*** | (2006.01) |
| ***G03F 7/09*** | (2006.01) |
| ***G03F 7/16*** | (2006.01) |
| ***G03F 7/20*** | (2006.01) |
| ***G03F 7/42*** | (2006.01) |
| ***H10P 14/69*** | (2026.01) |
| ***H10P 76/20*** | (2026.01) |
| ***H10P 76/40*** | (2026.01) |
| ***H10W 20/00*** | (2026.01) |

(52) U.S. Cl.

CPC ............ *G03F 7/0757* (2013.01); *G03F 7/094* (2013.01); *G03F 7/16* (2013.01); *G03F 7/2002* (2013.01); *G03F 7/425* (2013.01); *H10P 14/6903* (2026.01); *H10P 50/283* (2026.01); *H10P 50/287* (2026.01); *H10P 76/2041* (2026.01); *H10P 76/405* (2026.01); *H10P 76/4085* (2026.01); *H10W 20/01* (2026.01)

(56) References Cited

U.S. PATENT DOCUMENTS

| | | | | |
|---|---|---|---|---|
| 6,627,587 | B2 | 9/2003 | Naghshineh et al. | |
| 6,794,307 | B2 | 9/2004 | Chen et al. | |
| 7,442,675 | B2 | 10/2008 | Yokoi et al. | |
| 8,916,475 | B1 | 12/2014 | Chen et al. | |
| 9,127,161 | B2 | 9/2015 | Takase et al. | |
| 9,442,377 | B1 | 9/2016 | Ongayi et al. | |
| 9,873,833 | B2 | 1/2018 | Parris et al. | |
| 9,934,971 | B2 | 4/2018 | Hsieh et al. | |
| 10,031,420 | B2 | 7/2018 | Ongayi et al. | |
| 10,049,876 | B1 | 8/2018 | Sankarapandian et al. | |
| 10,665,233 | B2 | 5/2020 | Retter et al. | |
| 2003/0003714 | A1* | 1/2003 | Lee | H01L 21/76804 257/E21.507 |
| 2004/0020134 | A1 | 2/2004 | Kim et al. | |
| 2006/0154839 | A1 | 7/2006 | Ilardi et al. | |
| 2007/0117411 | A1* | 5/2007 | Ogihara | G03F 7/091 438/305 |
| 2007/0149430 | A1* | 6/2007 | Egbe | C11D 7/34 510/175 |
| 2008/0004197 | A1 | 1/2008 | Kneer | |
| 2008/0006305 | A1 | 1/2008 | Bernhard et al. | |
| 2008/0026585 | A1 | 1/2008 | Kim et al. | |
| 2008/0161217 | A1 | 7/2008 | Zhang et al. | |
| 2008/0260968 | A1* | 10/2008 | Kim | C23C 16/45512 427/249.1 |
| 2009/0111726 | A1 | 4/2009 | Shang | |
| 2009/0258495 | A1* | 10/2009 | Chan | H10B 63/10 257/E21.241 |
| 2012/0115303 | A1* | 5/2012 | Gambino | H01L 21/76802 438/399 |
| 2017/0059987 | A1 | 3/2017 | Choi et al. | |
| 2017/0236836 | A1 | 8/2017 | Huo et al. | |
| 2018/0005946 | A1 | 1/2018 | Alur et al. | |
| 2018/0174894 | A1 | 6/2018 | Bouche et al. | |

FOREIGN PATENT DOCUMENTS

| | | | |
|---|---|---|---|
| CN | 105733587 | A | 7/2016 |
| CN | 106243357 | A | 12/2016 |
| CN | 106887382 | A | 6/2017 |
| DE | 602004009595 | T2 | 7/2008 |
| JP | H1116882 | A | 1/1999 |
| JP | 4968477 | B2 | 7/2012 |
| KR | 20010107597 | A | 12/2001 |
| KR | 20080046073 | A | 5/2008 |
| KR | 20100076999 | A | 7/2010 |
| TW | 200724649 | A | 7/2007 |
| TW | 200813211 | A | 3/2008 |
| TW | 200823611 | A | 6/2008 |
| WO | 2017084860 | A1 | 5/2017 |

* cited by examiner

CHEMICAL COMPOSITION FOR TRI-LAYER REMOVAL

PRIORITY CLAIM AND CROSS-REFERENCE

This application is a continuation of U.S. patent application Ser. No. 17/007,733, entitled "Chemical Composition for Tri-Layer Removal," filed Aug. 31, 2020, which is a continuation of U.S. application Ser. No. 15/723,875, entitled "Chemical Composition for Tri-Layer Removal," filed Oct. 3, 2017, now U.S. Pat. No. 10,761,423 issued Sep. 1, 2020, which claims the benefit of the U.S. Patent Application No. 62/551,985, filed Aug. 30, 2017, and entitled "Chemical Composition for Tri-Layer Removal," which applications are hereby incorporated herein by reference.

BACKGROUND

In the formation of integrated circuits, the components of the integrated circuit devices need to be patterned to form desirable shapes. A typical patterning process includes a photo lithography process, which includes coating a photo resist over a target layer that is to be patterned, light-exposing the photo resist using a lithography mask, developing the photo resist, and using the developed photo resist as an etching mask to etch the target layer. As a result, the layout of the developed photo resist is transferred to the underlying layer. The photo resist is then removed.

In some situations, after the photo resist is patterned, it may be found that the patterned photo resist has defects. The patterned photo resist is thus removed, and a new photo resist is applied and patterned again.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
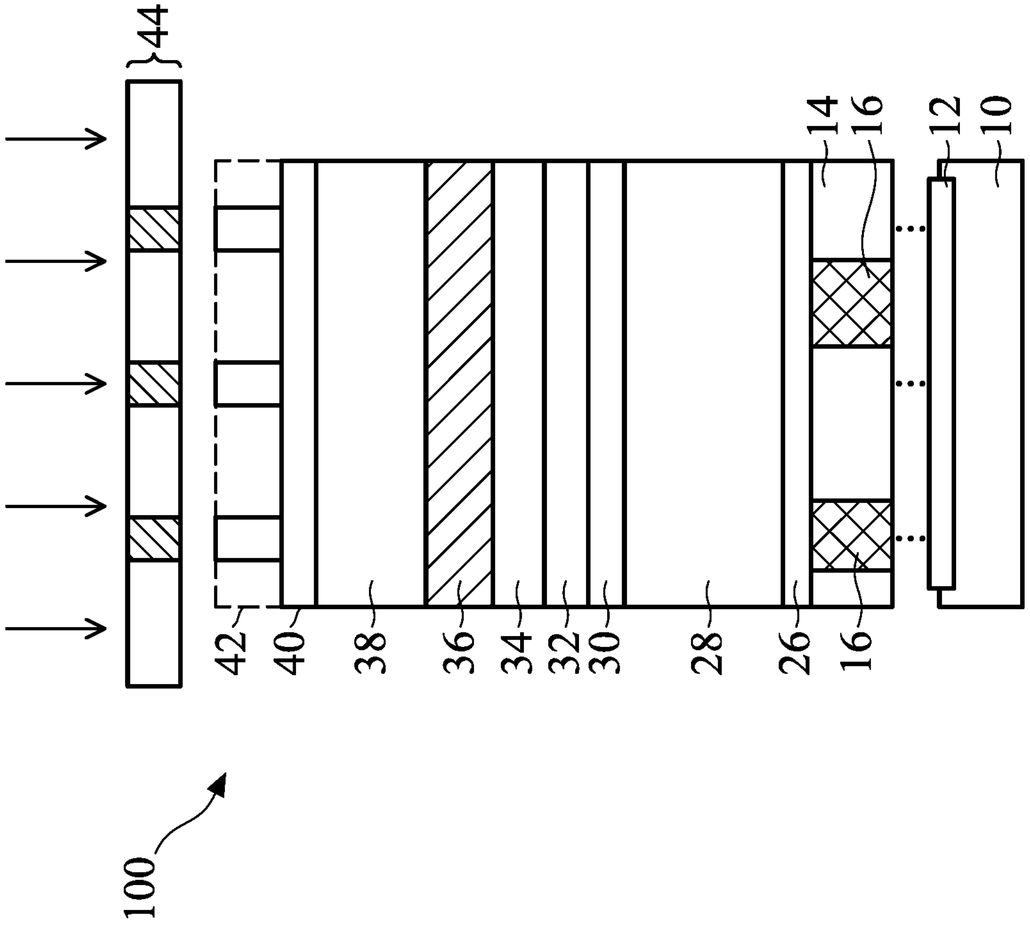
FIGS. 1 through 11 illustrate the cross-sectional views of intermediate stages in the formation of metal lines and vias in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A method of performing rework on tri-layers used for photo lithography process and the chemical solution used for the rework are provided in accordance with various exemplary embodiments. The intermediate stages of the rework are illustrated in accordance with some embodiments. Some variations of some embodiments are discussed. Throughout the various views and illustrative embodiments of the present disclosure, like reference numbers are used to designate like elements.

Figure 21:
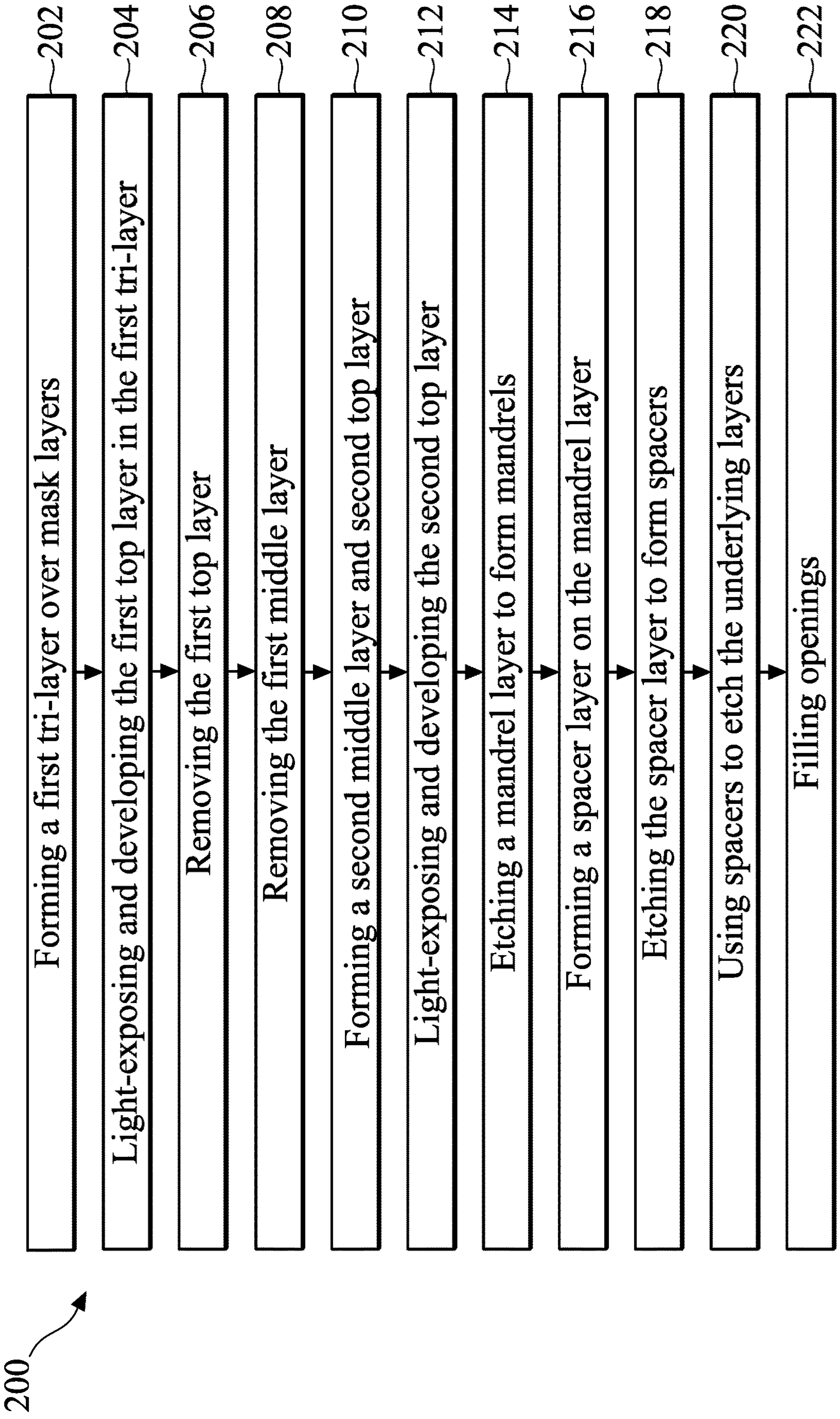
FIG. 21 illustrates a process flow in accordance with some embodiments.

FIGS. 1 through 11 illustrate the cross-sectional views of intermediate stages in the formation of metal lines and vias in accordance with some embodiments of the present disclosure. The steps shown in FIGS. 1 through 11 are also reflected schematically in the process flow 200 as shown in FIG. 21. It is appreciated that the process shown in FIGS. 1 through 11 is an exemplary embodiment for performing photo lithography rework of tri-layers, and the embodiments may be applied on the photo lithography processes for etching other features including, and not limited to, semiconductor substrates, metal layers, etc. For example, the photo lithography process in accordance with the embodiment of the present disclosure may be used for the formation of semiconductor fins, on which Fin Field-Effect Transistors (FinFETs) are formed.

FIG. 1 illustrates a portion of wafer 100, which includes substrate 10 and a plurality of layers formed over substrate 10. Substrate 10 may be formed of a semiconductor material such as silicon, silicon germanium, or the like. In accordance with some embodiments of the present disclosure, substrate 10 is a crystalline semiconductor substrate such as a crystalline silicon substrate, a crystalline silicon carbon substrate, a crystalline silicon germanium substrate, a III-V compound semiconductor substrate, or the like. Active devices 12, which may include transistors therein, are formed at a top surface of substrate 10.

Dielectric layer 14 is formed over substrate 10. In accordance with some embodiments of the present disclosure, dielectric layer 14 is an Inter-Metal Dielectric (IMD) or an Inter-Layer Dielectric (ILD), which may be formed of a dielectric material. The dielectric constant (k value) of dielectric layer 14 may be lower than 3.8, lower than about 3.0, or lower than about 2.5, for example. In accordance with some embodiments of the present disclosure, conductive features 16, which may be metallic features such as copper lines or tungsten plugs, are formed in dielectric layer 14. Etch stop layer 26 is formed over dielectric layer 14. Etch stop layer 26 may be formed of a dielectric material such as silicon carbide, silicon nitride, or the like.

Dielectric layer 28 is further formed over etch stop layer 26. Dielectric layer 28 may be an IMD layer, which is formed of a dielectric material having a dielectric constant (k value) lower than 3.8, lower than about 3.0, or lower than about 2.5, for example. In accordance with alternative embodiments of the present disclosure, dielectric layer 28 is a non-low-k dielectric layer having a k value higher than 3.8.

In accordance with alternative embodiments of the present disclosure, layer 28 is a semiconductor substrate, wherein the subsequent process steps may be used to form Shallow Trench Isolation (STI) regions, for example. In accordance with these embodiments, there may not be additional layers underlying layer 28. Throughout the description, layer 28 is also referred to as a target layer that is to be etched, in which a plurality of patterns is to be formed in accordance with embodiments of the present disclosure.

Over low-k dielectric layer 28 resides one or a plurality of hard masks. It is appreciated that depending on the process, different number of hard masks may be adopted. In accordance with some exemplary embodiments, the hard masks include layers 30, 32, and 34. Dielectric hard mask 30, which may be formed of silicon oxide (such as tetraethylorthosilicate (TEOS) oxide), Nitrogen-Free Anti-Reflective Coating (NFARC, which is an oxide), silicon carbide, silicon oxynitride, or the like. The formation methods include Plasma Enhance Chemical Vapor Deposition (PECVD), High-Density Plasma (HDP) deposition, or the like.

Metal hard mask 32 is formed over dielectric hard mask 30. In accordance with some embodiments of the present disclosure, metal hard mask 32 is formed of titanium nitride, titanium, tantalum nitride, tantalum, or the like. The formation methods may include Physical Vapor Deposition (PVD), Radio Frequency PVD (RFPVD), Atomic Layer Deposition (ALD), or the like.

In accordance with some embodiments of the present disclosure, dielectric hard mask layer 34 is formed over metal hard mask 32. In accordance with alternative embodiments, dielectric hard mask layer 34 is not formed. Dielectric hard mask layer 34 may be formed of a material selected from the same candidate material for forming dielectric hard mask layer 30, and may be formed using a method that is selected from the same group of candidate methods for forming dielectric hard mask layer 30. Dielectric hard masks 30 and 34 may be formed of the same material, or may be formed of different materials.

Mandrel layer 36 is formed over dielectric hard mask 34. In accordance with some embodiments of the present disclosure, mandrel layer 36 is formed of amorphous silicon or another material that has a high etching selectivity relative to the underlying dielectric hard mask 32.

Over mandrel layer 36, a tri-layer is formed, which includes bottom layer 38 (sometimes referred to as a under layer), middle layer 40 over bottom layer 38, and top layer 42 over middle layer 40. The respective step is illustrated as step 202 in the process flow 200 shown in FIG. 21. In accordance with some embodiments of the present disclosure, bottom layer 38 includes carbon, hydrogen, and oxygen, and is formed of a material similar to photo resist. Furthermore, all of bottom layer 38 is cross-linked, and hence is different from typical photo resists used for light exposure. Alternatively stated, bottom layer 38 is not able to have some portions removed through photo exposure and development. Bottom layer 38 functions as a Bottom Anti-Reflective Coating (BARC) when top layer 42 is light-exposed.

Figure 12:
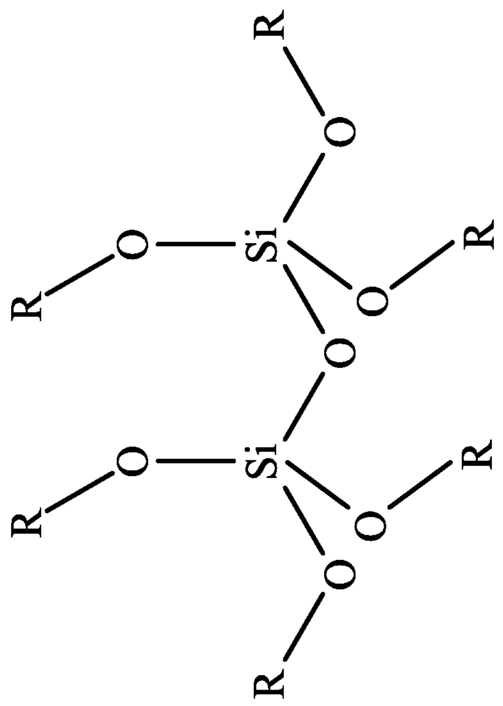
FIG. 12 illustrates a diagram of siloxane in accordance with some embodiments.
Figure 20:
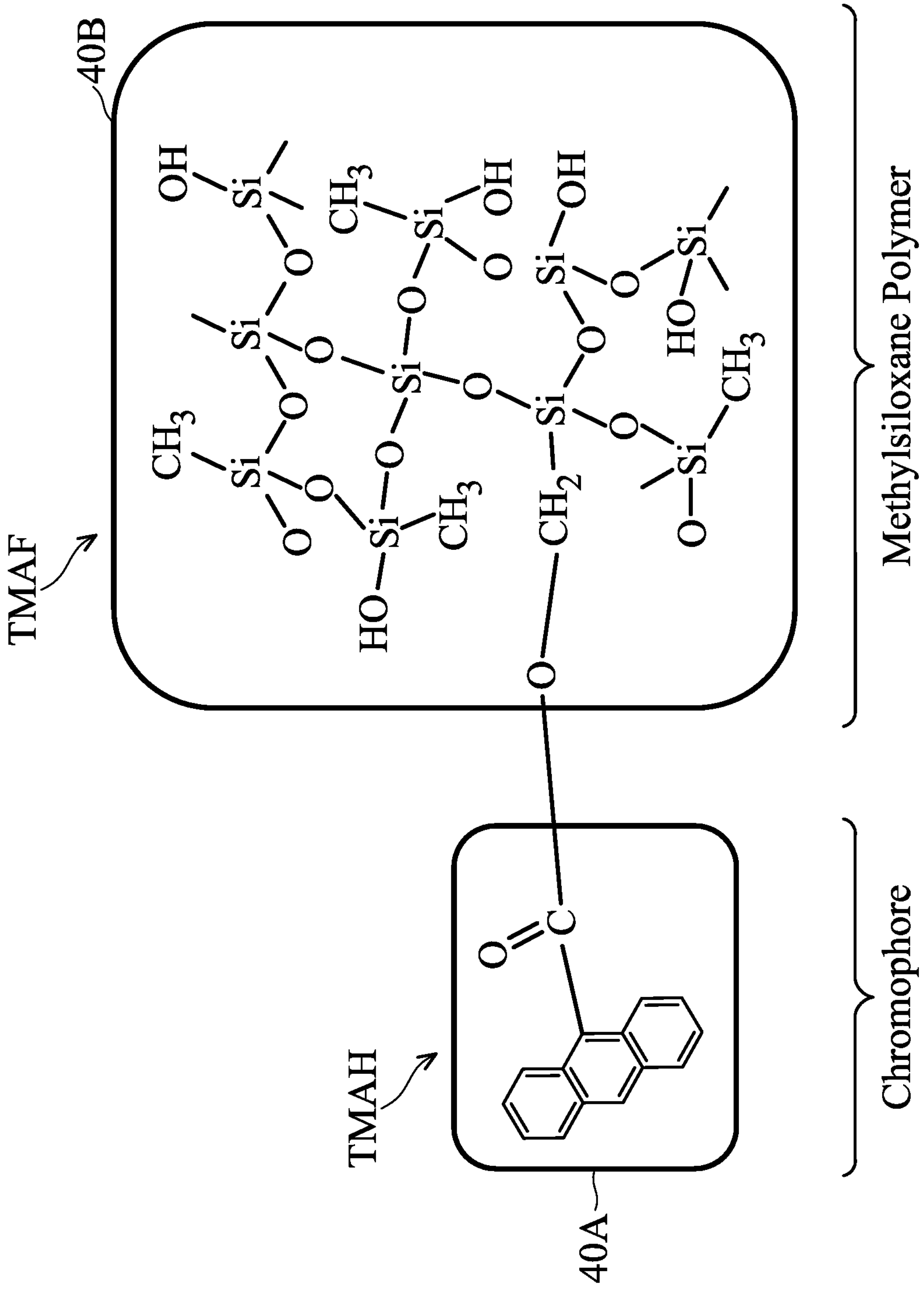
FIG. 20 illustrates a diagram of a portion of an exemplary middle layer in accordance with some embodiments.

Middle layer 40 may be formed of a material including silicon and oxygen, and hence has some of its property similar to silicon oxide. For example, middle layer 40 may include between about 30 weight percent and about 60 weight percent silicon oxide. On the other hand, middle layer 40 further includes organic groups bonded to silicon and oxygen as a polymer. In accordance with some embodiments of the present disclosure, middle layer 40 includes siloxane, which includes the chain of Si—O—Si bonds. Middle layer 40 also has a glass-like surface, and may densify over time. For example, FIG. 12 illustrates a part of an exemplary composition of middle layer 40, in which a first silicon atom, an oxygen atom, and a second silicon atom are bonded to form a part of siloxane. It is appreciated that although two silicon atoms are illustrated as an example, more silicon atoms may be bonded through oxygen atoms to form a much larger structure, as also illustrated in FIG. 20. As shown in FIG. 12, the oxygen atoms may be terminated by function groups such as ethyl groups, methyl groups, or the like. In accordance with some embodiments of the present disclosure, middle layer 40 has a thickness in the range between about 200 Å and about 350 Å.

Referring back to FIG. 1, top layer 42 is formed of a photo resist, which may include organic materials. Top layer 42 is applied as a blanket layer, which includes the dashed portions and solid portions as shown in FIG. 1. Next, a photo lithography process is performed, and photo lithography mask 44 is used to perform a light exposure on top layer 42. The respective step is illustrated as step 204 in the process flow 200 shown in FIG. 21. Photo lithography mask 44 includes opaque portions and transparent portions, and hence some portions (such as the dashed portions) of top layer 42 are exposed, and other portions (such as solid portions) are not exposed. After the light exposure, some portions (such as the exposed portions) are removed in a development step, and other portions (such as unexposed portions) remain after the development step. The respective development step is also illustrated as step 204 in the process flow 200 shown in FIG. 21. It is realized that the illustrated lithography mask 44, which is transmission-type, is merely an example to show how patterns are formed, and other types of lithography masks such as reflective-type masks may also be used.

Figure 2:
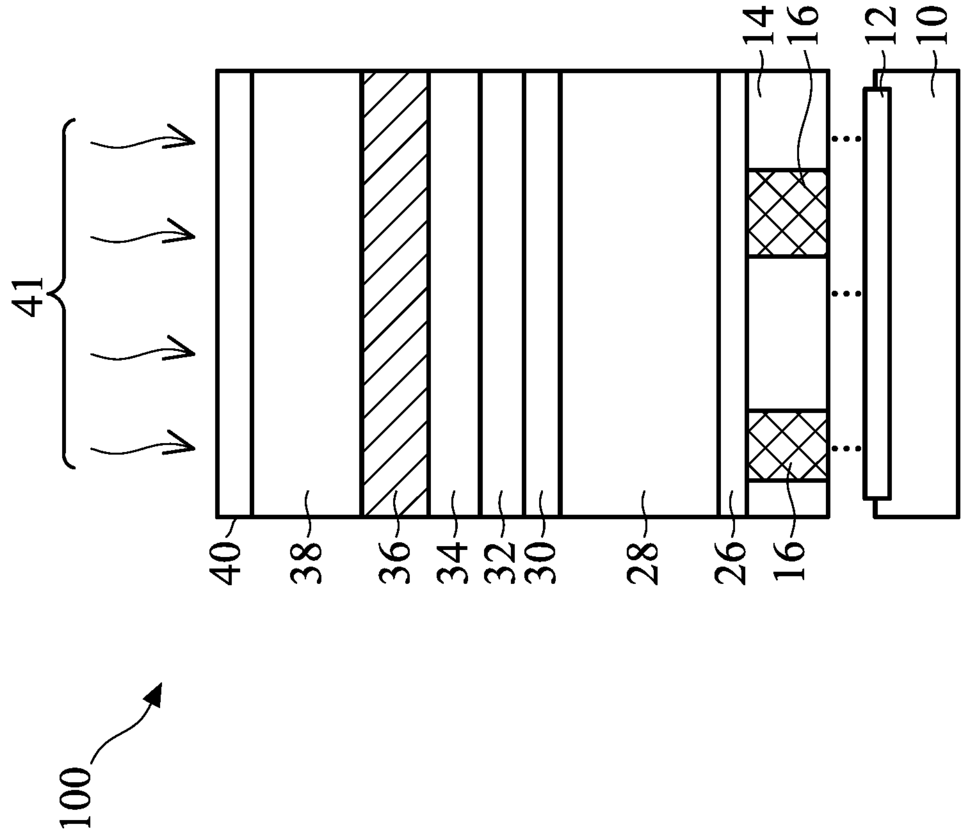
Figure 3:
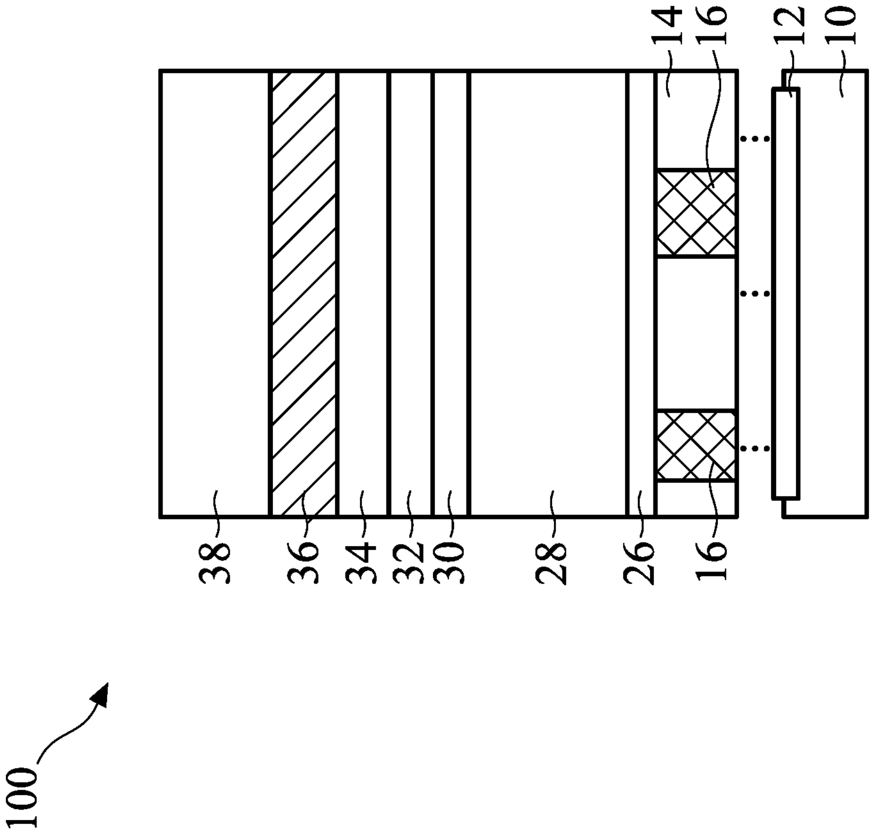
Figure 4:
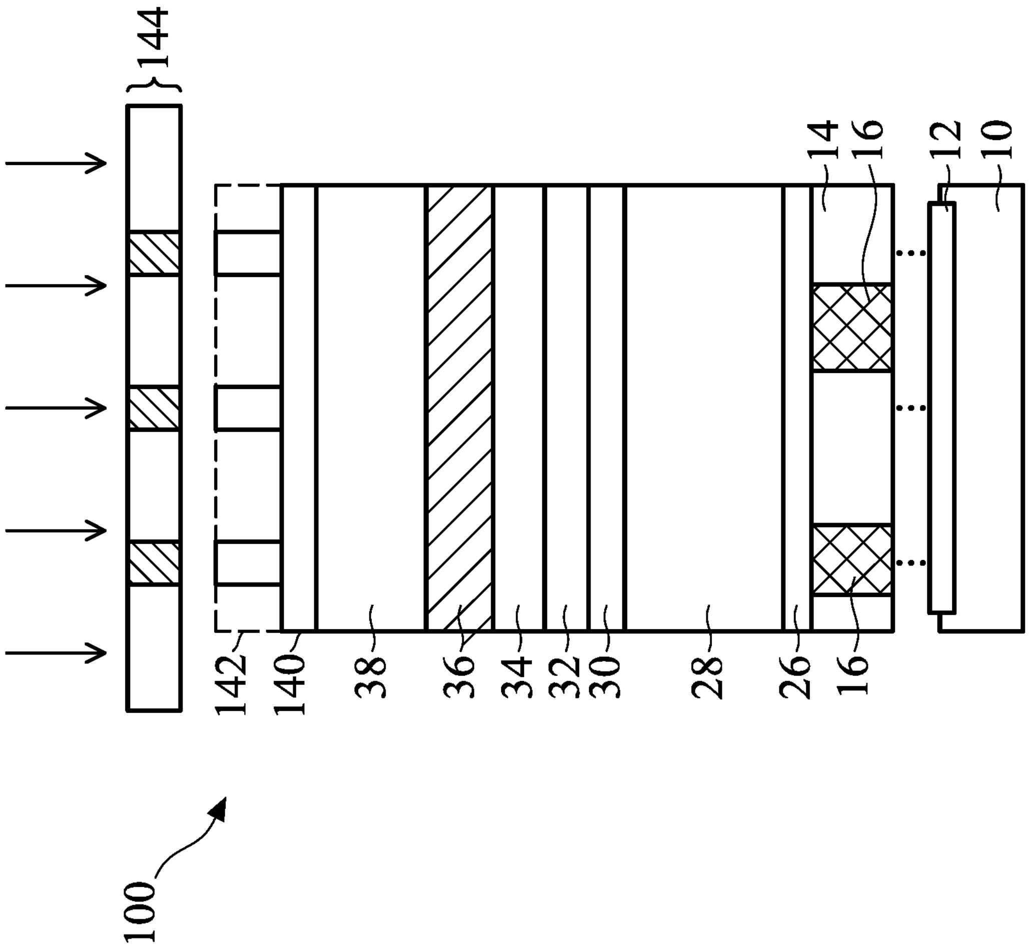

After the development, the patterned top layer 42 is inspected to check the patterns against specification. For example, the widths (critical dimensions), the straightness, and the width uniformity may be inspected. Through the inspection, the patterned top layers 42 on some wafers may be determined as having defects, and rework is needed. Accordingly, the steps shown in FIGS. 2 through 4 are performed to rework on the top layer. The patterned top layers 42 on some other wafers may be determined as meeting the specification. Accordingly, the rework steps as shown in FIGS. 2 through 4 are skipped, and the process continues starting from the step shown in FIG. 5 for these wafers.

The top layer 42 that needs to be reworked is first removed. The resulting structure is shown in FIG. 2. The respective step is illustrated as step 206 in the process flow 200 shown in FIG. 21. In accordance with some embodiments of the present disclosure, the removal of top layer 42 includes a wet etch process using a solvent. For example, a mixture of 70% Propylene glycol monomethylether and 30% propylene glycol monomethylether acetate (in combination known as OK73, which is a photo resist thinner) may be used. In accordance with alternative embodiments of the present disclosure, the top layer 42 is removed in an ashing process, wherein oxygen ($O_2$) is used to remove the top layer 42.

Middle layer 40 is then removed in a wet etching process, and the etching and the respective chemical solution are represented using arrows 41 as shown in FIG. 2. The resulting structure is shown in FIG. 3. The respective step is illustrated as step 208 in the process flow 200 shown in FIG. 21. The removal of middle layer 40 stops on bottom layer 38, so that the top surface of bottom layer 38 is exposed. In the removal of middle layer 40 (with or without top layer 42), wafer 100 is submerged in the chemical solution, until middle layer 40 is fully removed.

The chemical solution for removing middle layer 40 includes either an alkali, a fluoride, or a mixture of both. The alkali may be a quaternary ammonium hydroxide in accordance with some embodiments of the present disclosure. The fluoride may be a quaternary ammonium fluoride in accordance with some embodiments of the present disclosure. The chemical solution further includes an organic solvent and water. Both of the quaternary ammonium hydroxide and the quaternary ammonium fluoride have the function of breaking the bonds in middle layer 40 and hence etching middle layer 40. The organic solvent has the function of stabilizing the molecules de-bonded from middle layer 40, and preventing the molecules that are de-bonded from re-bonding again to re-form the siloxane (which means re-forming (depositing) middle layer 40).

In accordance with some embodiments of the present disclosure, the quaternary ammonium hydroxide used in the chemical solution is selected from tetramethylammonium hydroxide (TMAH), tetraethylammonium hydroxide, tetrapropylammonium hydroxide, tetrabutylammonium hydroxide, methyltripropylammonium hydroxide, methyltributylammonium hydroxide, benzyltrimethylammonium hydroxide, benzyltriethylammonium hydroxide, choline hydroxide ((2-Hydroxyethyl)trimethylammonium) hydroxide, and combinations thereof.

Figure 13:
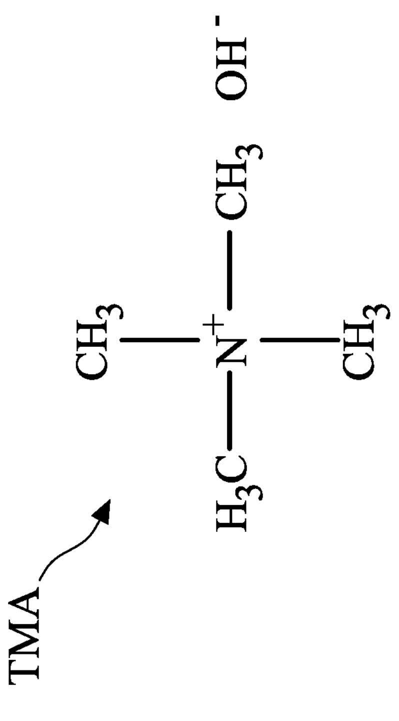
FIG. 13 illustrates the dissociated tetramethylammonium hydroxide (TMAH) in accordance with some embodiments.
Figure 14:
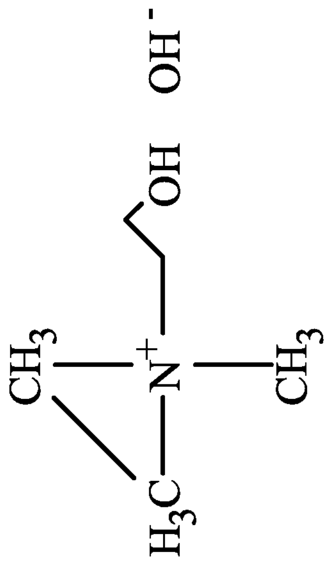
FIG. 14 illustrates the dissociated choline hydroxide in accordance with some embodiments.

The quaternary ammonium hydroxide is an alkali, and the hydroxide in the quaternary ammonium hydroxide provides an $OH^-$ molecule when dissociated. For example, FIG. 13 illustrates the dissociated TMAH, wherein the molecules of TMA and $OH^-$ that have been dissociated from each other, are illustrated. FIG. 14 illustrates the dissociated choline hydroxide, wherein the molecules of choline and $OH^-$ that have been dissociated from each other, are illustrated. The $OH^-$ reacts with siloxane through siloxane hydrolysis to form silanol, and during this process, the middle layer 40, which is formed of siloxane, is broken apart and hence is etched.

Figure 15:
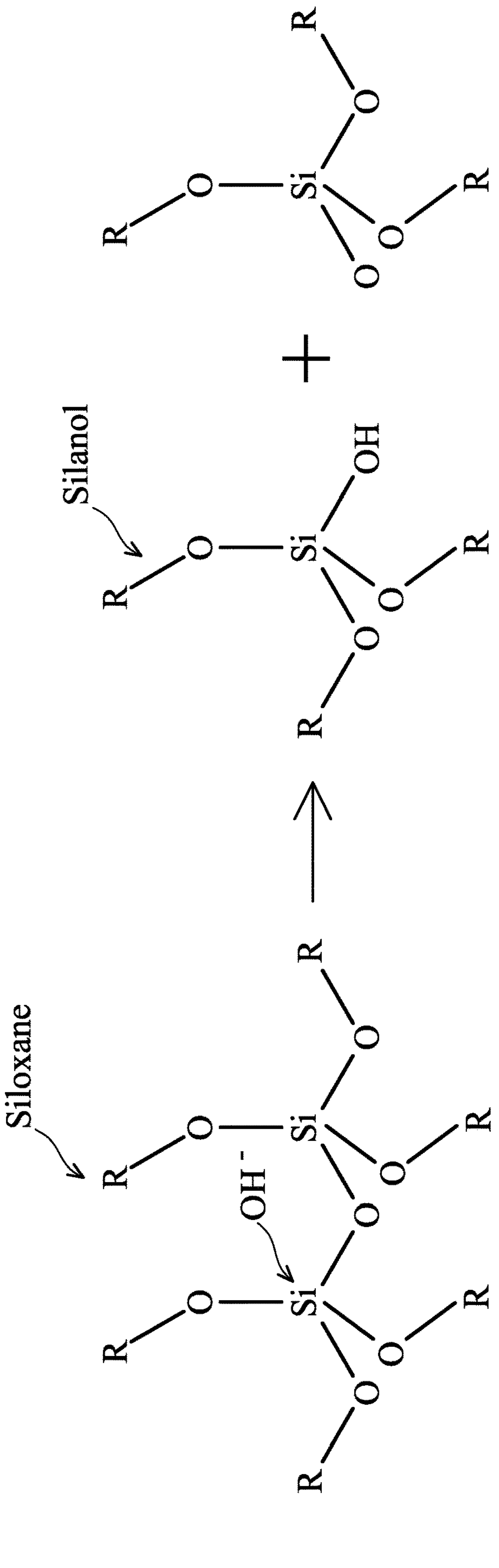
FIG. 15 illustrates an exemplary siloxane hydrolysis of TMAH in accordance with some embodiments.

FIG. 15 illustrates an exemplary siloxane hydrolysis of TMAH in accordance with some embodiments of the present disclosure. The illustrated exemplary siloxane (which is the component of middle layer 40) includes Si—O—Si bonds. Although one Si—O—Si bond is illustrated as an example, there may be multiple Si—O—Si bonds to extend the chain. The $OH^-$ molecule attacks one of the Si—O bond, and forms a bond with the Si atom. As a result, the silanol, which includes a silicon atom bonded to an OH group, is formed.

The chemical solution for etching middle layer 40 preferably does not include the alkali with small molecule weight, for example, with molecule weight lower than about 60. The alkali excluded from middle layer 40 may include KOH, NaOH, $NH_4OH$, etc. The alkali with small molecule weight has a low steric hindrance, and hence is prone to penetrating into bottom layer 38 since bottom layer 38 is porous. The alkali, if penetrates into bottom layer 38, may be released during the subsequent photo lithography process (FIG. 4), and may react with the photo resist acid in the photo resist, and hence may adversely affect the subsequent photo lithography process. On the other hand, the quaternary ammonium hydroxide has high steric hindrance, and does not penetrate into bottom layer 38.

In accordance with some embodiments of the present disclosure, the quaternary ammonium fluoride is selected from ammonium fluoride, ammonium bifluoride, tetramethylammonium fluoride (TMAF), tetrabutylammonium fluoride, tetraethylammonium hydroboron tetrafluoride, tetrabutylammonium tetrafluoroborate, tetraethylammonium tetrafluoroborate, and combinations thereof.

Figure 17:
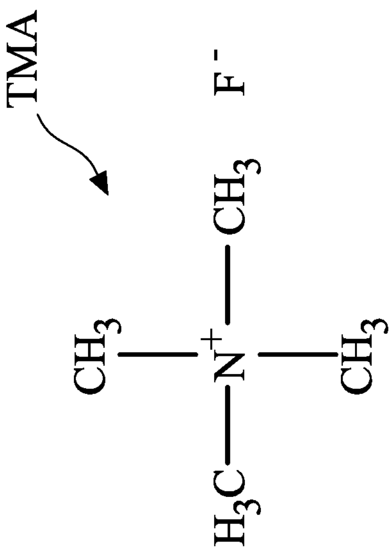
FIG. 17 illustrates the dissociated tetramethylammonium fluoride (TMAF) in accordance with some embodiments.
Figure 18:
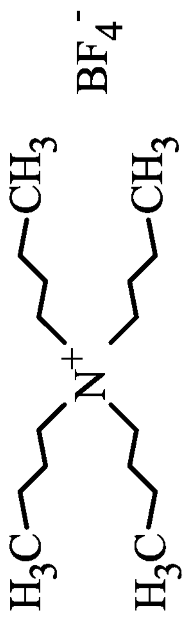
FIG. 18 illustrates the dissociated tetrabutylammonium tetrafluoroborate in accordance with some embodiments.

The quaternary ammonium fluoride provides a $F^-$ ion, a $BF_4^-$ molecule, or the like when dissociated. For example, FIG. 17 illustrates the dissociated TMAF, and the TMA molecule and $F^-$ ion dissociated from the TMAF are illustrated. FIG. 18 illustrates the dissociated tetrabutylammonium tetrafluoroborate, and the molecules of tetrabutylammonium and tetrafluoroborate ($BF_4^-$), which have been dissociated from each other. The $F^-$ ion or the $BF_4^-$ molecule reacts with siloxane, and during this process, the middle layer 40, which includes siloxane, is broken apart and hence is etched.

Figure 19:
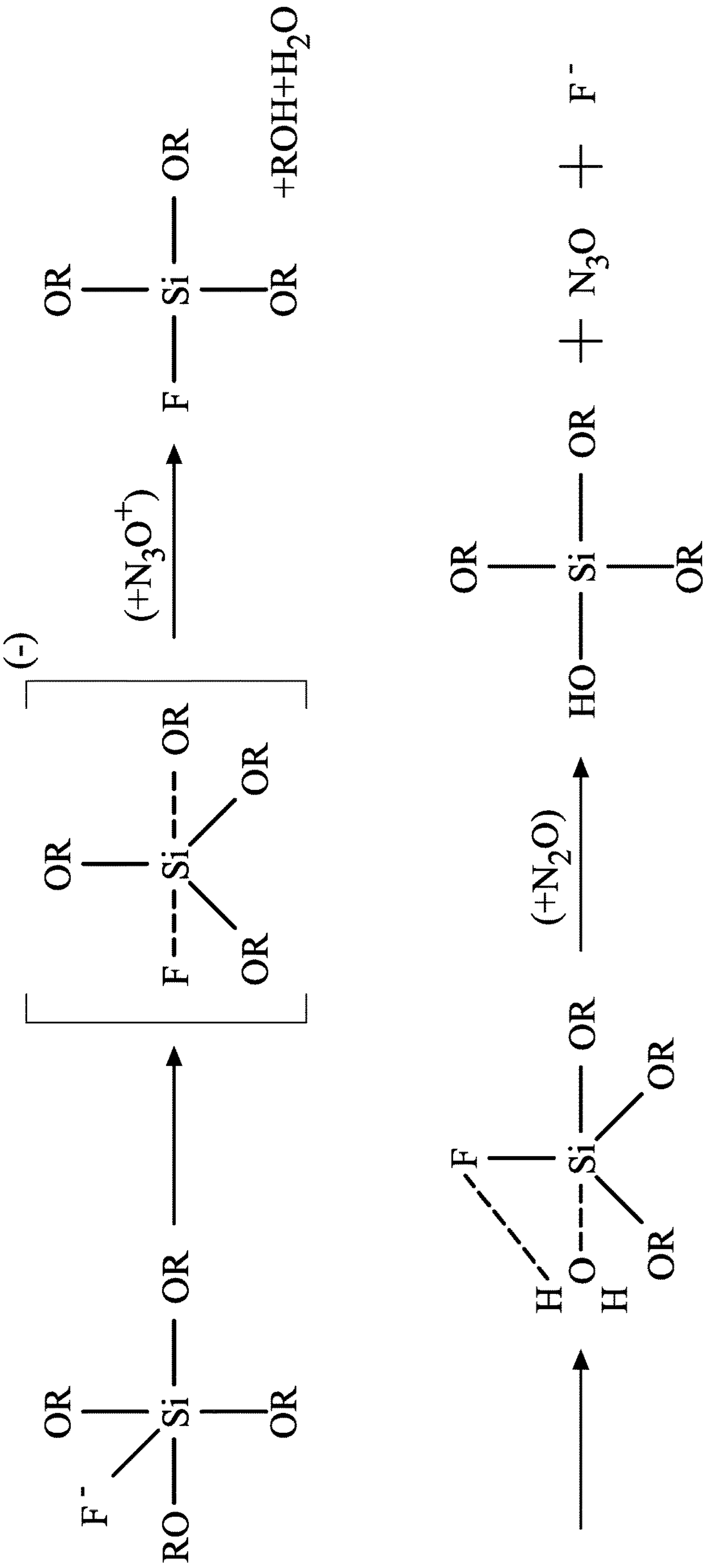
FIG. 19 illustrates an exemplary process in which TMAF reacts with siloxane in accordance with some embodiments.

FIG. 19 illustrates an exemplary process in which a $F^-$ ion (for example, from the dissociated TMAF) reacts with the siloxane in middle layer 40 in accordance with some embodiments of the present disclosure. The illustrated exemplary siloxane is attacked by a $F^-$ ion. Further with the $H_3O+$ (in water) joining the reaction, the $F^-$ ion is bonded with a silicon atom. Hence, siloxane is etched. It is appreciated that the fluorine atom bonded to silicon may further be replaced by the OH group in water, and the $F^-$ ion is separated as a discrete (un-bonded) ion again. Accordingly, the separated $F^-$ ion may join the further etching of siloxane. This means that the $F^-$ ion may repeatedly join the reaction to etch more siloxane. Accordingly, a small amount of $F^-$ ion is adequate for the reaction, and the efficiency of the $F^-$ ion in the etching of middle layer 40 is high.

In accordance with some embodiments of the present disclosure, the chemical solution for etching middle layer 40 preferably does not include the fluoride having a small molecule weight such as HF. For example, the fluorides with molecule weights lower than about 60 are not used in the etching solution. Similarly, the fluorides with small molecule weight may have small steric hindrance, and hence are prone to penetrating into bottom layer 38 since bottom layer 38 is porous. The fluoride penetrated into bottom layer 38 may be released during the subsequent photo lithography process (FIG. 4) to damage the subsequently formed middle layer, and adversely affects the subsequent photo lithography process. On the other hand, the quaternary ammonium fluorides have high steric hindrance, and do not penetrate into bottom layer 38.

In accordance with some embodiments of the present disclosure, either one of quaternary ammonium hydroxide and quaternary ammonium fluoride is used in the chemical solution for etching middle layer 40. In accordance with some embodiments of the present disclosure, both quaternary ammonium hydroxide and quaternary ammonium fluoride are adopted in the chemical solution for etching middle layer 40. Since a significant (weight) percentage of middle layer 40 is silicon oxide, quaternary ammonium fluoride may be used as an efficient etchant. On the other hand, quaternary ammonium fluoride is not very efficient in etching large organic groups such as benzyl groups, while quaternary ammonium hydroxide is efficient in the etching of large organic groups. Accordingly, quaternary ammonium hydroxide and quaternary ammonium fluoride may compensate for each other's etching ability to make the etching of middle layer 40 more efficient. FIG. 20 illustrates a diagram of a portion of an exemplary middle layer 40. The left portion in rectangular region 40A is Chromorphore, which has a large organic group, and it is efficient to etch this portion using TMAH. The right portion in rectangular region 40B is a methylsiloxane polymer, and it is efficient to etch this portion using TMAF.

Table 1 illustrates the results of etching 12 samples using chemical solutions including TMAH, TMAF, and ethylene glycol (EG, as an organic solvent). The chemical solutions for etching the 12 samples have different combinations of weight percentages of TMAH, TMAF, and ethylene glycol.

TABLE 1

| Sample # | TMAH percentage | TMAF percentage | EG Percentage | Etching rate (Å/minute) |
|---|---|---|---|---|
| 1 | 1.5% | 0.25% | N/A | 350 |
| 2 | 0.5% | 1.5% | N/A | 500 |
| 3 | 1.5% | 1.5% | N/A | 400 |
| 4 | 1.5% | 0.25% | 1% | 350 |
| 5 | 0.5% | 1.5% | 1% | 500 |
| 6 | 1.5% | 1.5% | 1% | 400 |
| 7 | 1.5% | 0.25% | 5% | 350 |
| 8 | 0.5% | 1.5% | 5% | 500 |
| 9 | 1.5% | 1.5% | 5% | 400 |
| 10 | 1.5% | 0.25% | 10% | 350 |
| 11 | 0.5% | 1.5% | 10% | 500 |
| 12 | 0.5% | 1.5% | 10% | 400 |

In Table 1, the etching rates (Δ/minute) of the samples are illustrated. The results indicate that the ratio of the weight percentage of TMAH to the weight percentage of TMAF (shown as TMAH:TMAF hereinafter) affects the etching rate significantly. For example, it was found that when the ratio TMAH:TMAF is about 1:3, the highest etching rate 500 Å/minute can be reached, which results in the highest throughput in production. Accordingly, in accordance with some exemplary embodiments of the present disclosure, the ratio of TMAH:TMAF in the etching solution is close to 1:3, for example, in the range between about 1:1 and about 1:5. On the other hand, the percentage of the organic solvent in the chemical solution does not significantly affect the etching rate. However, the type and the weight percentage of the organic solvent may play a role in improving the etching selectivity between middle layer 40 and bottom layer 38.

Referring back to FIG. 15, as a by-product of the siloxane hydrolysis, in addition to the formed silanol, there is a molecule having an oxygen atom with a dangling bond. This molecule is unstable, and is prone to reaction with other similar molecules to form siloxane again, which may be re-deposited on bottom layer 38 (FIG. 3) to re-form middle layer 40. To solve this problem, an organic solvent, which has the function of stabilizing the molecules to prevent the molecules from re-bond with each other and re-deposit, is adopted in the chemical solution for etching middle layer 40. In accordance with some embodiments of the present disclosure, the selected organic solvent(s) in the chemical solution have the boiling temperature higher than about 100° C. since in the etching of middle layer 40, the temperature may be elevated, for example, to a temperature in the range between about 35° C. and about 60° C. In accordance with some embodiments of the present disclosure, since the chemical solution includes mainly water, the selected organic solvents are also water soluble.

In accordance with some embodiments of the present disclosure, the candidate organic solvents include Tetrahydrofurfuryl Alcohol (THFA), Butyl Diglycol (BDG), ethylene glycol (EG), propanol, glycerin, sulfolane, Dimethyl Sulfoxide (DMSO), Triethanolamine (TEA), or combinations thereof. Also, the organic solvents may exclude some organic solvents having small molecule weights such as ethers and primary amines. Accordingly, the organic solvents that include Tetrahydrofuran (THF), propylene glycol monomethyl ether (PGME), and/or monoethanolamine (MEA) may be excluded. Experiment results also revealed that these organic solvents caused middle layer 40 to be lifted off rather than etched, hence may cause the damage of the underlying bottom layer 38 (FIG. 3).

Figure 16:
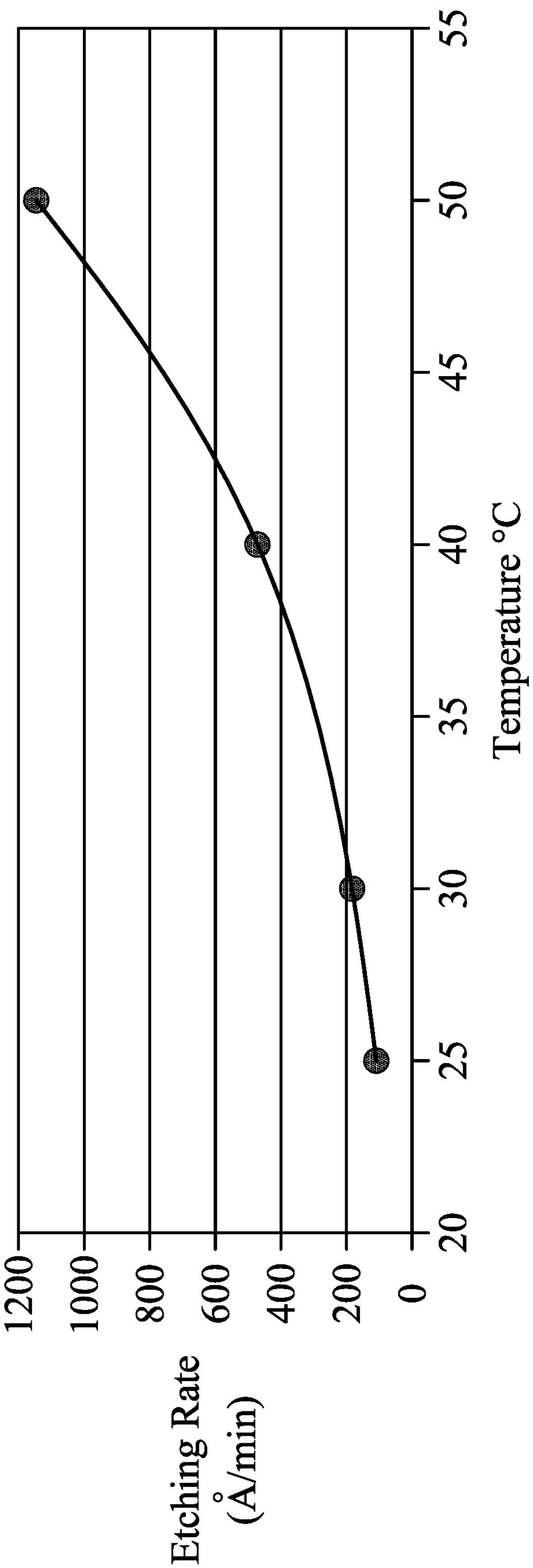
FIG. 16 illustrates the etching rate of a middle layer as a function of the temperature of the chemical solution in accordance with some embodiments.

Experimental results revealed that the etching rate is related to the temperature of the chemical solution, and the etching rate increases when the temperature increases. For example, FIG. 16 illustrates the etching rate of the middle layer as a function of the temperature of the chemical solution. The chemical solution includes 0.5 weight percent TMAH, 1.5 weight percent TMAF, and 2 weight percent EG. The experimental results indicate that when temperature reaches close to about 40° C., the etching rate may achieve the desirable value of about 400 Å/minute or higher.

Referring back to FIGS. 2 and 3, when the middle layer 40 is etched using the chemical solution, the bottom layer 38 is not etched, and preferably has as small damage as possible, so that bottom layer 38 may be reused in the subsequent photo lithography process as shown in FIG. 4. The etching selectivity in accordance with some embodiments of the present disclosure is high, for example, higher than about 100, and the etching selectivity is the ratio of the etching rate of middle layer 40 to the etching rate of bottom layer 38. The high etching selectivity may be achieved by selecting an appropriate type of solvent, and keeping the percentage of the solvent low. In accordance with some embodiments of the present disclosure, the solvent has a weight percentage smaller than about 20 percent, and may be in the range between about 10 percent and about 15 percent. The remaining components in the chemical solution are mainly water, which may have a weight percentage higher than about 70 percent. The weight percentage of water may be close to about 80 percent, or in the range between about 75 percent and about 85 percent.

Figure 5:
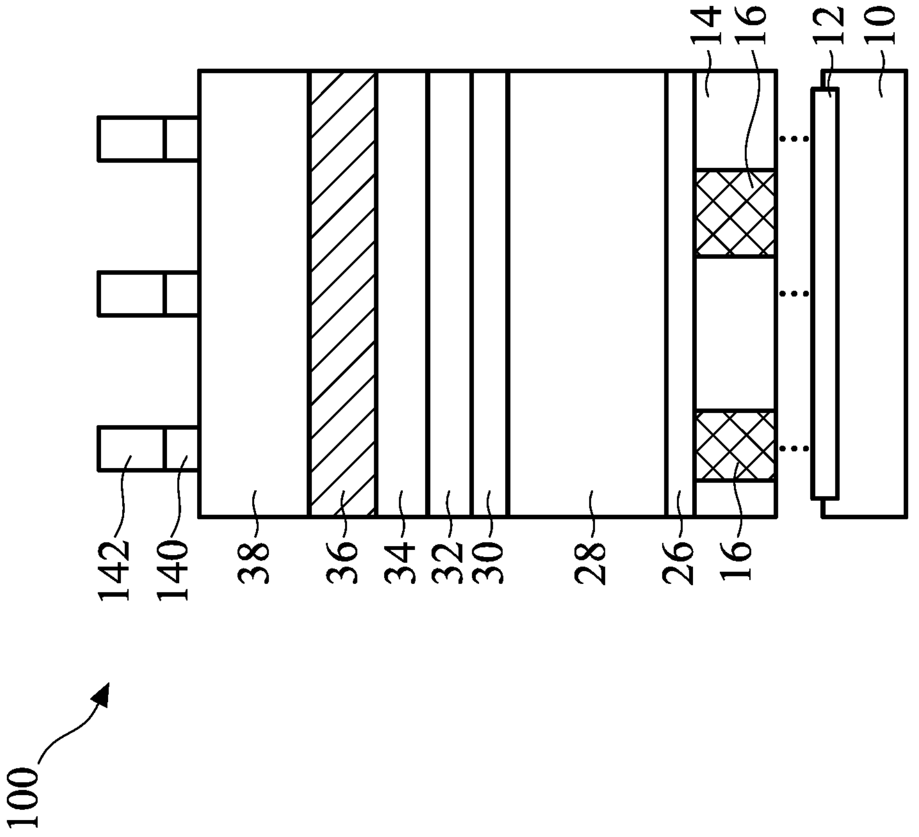

FIGS. 4 and 5 illustrate the rework of the photo resist. In accordance with some embodiments of the present disclosure, as shown FIG. 4, middle layer 140 and top layer 142 are formed. The respective step is illustrated as step 210 in the process flow 200 shown in FIG. 21. The material of middle layer 140 and top layer 142 may be essentially the same as or similar to that of middle layer 40 and top layer 42, respectively, as shown in FIG. 1. Next, a light exposure is performed on top layer 142, followed by a development step to remove the dashed portions of top layer 142. The respective step is illustrated as step 212 in the process flow 200 shown in FIG. 21. Photo lithography mask 144 is used for the light exposure of top layer 142. In accordance with some embodiments of the present disclosure, photo lithography mask 144 has an identical pattern as, or may be the same one, as the photo lithography mask 44 shown in FIG. 1. The exposed top layer 142 is then developed, and the dashed portions are removed. The respective step is also illustrated as step 212 in the process flow 200 shown in FIG. 21. An inspection is then performed to check the quality of the patterned top layer 142. If the quality (such as line width, straightness, uniformity, etc.) of top layer 142 meets the specification, top layer 142 will be used to etch underlying layers. If the quality of top layer 142 does not meet the specification, another rework will be performed by repeating the steps shown in FIGS. 2 through 4. The rework is repeated until the final top layer meets specification.

Figure 6:
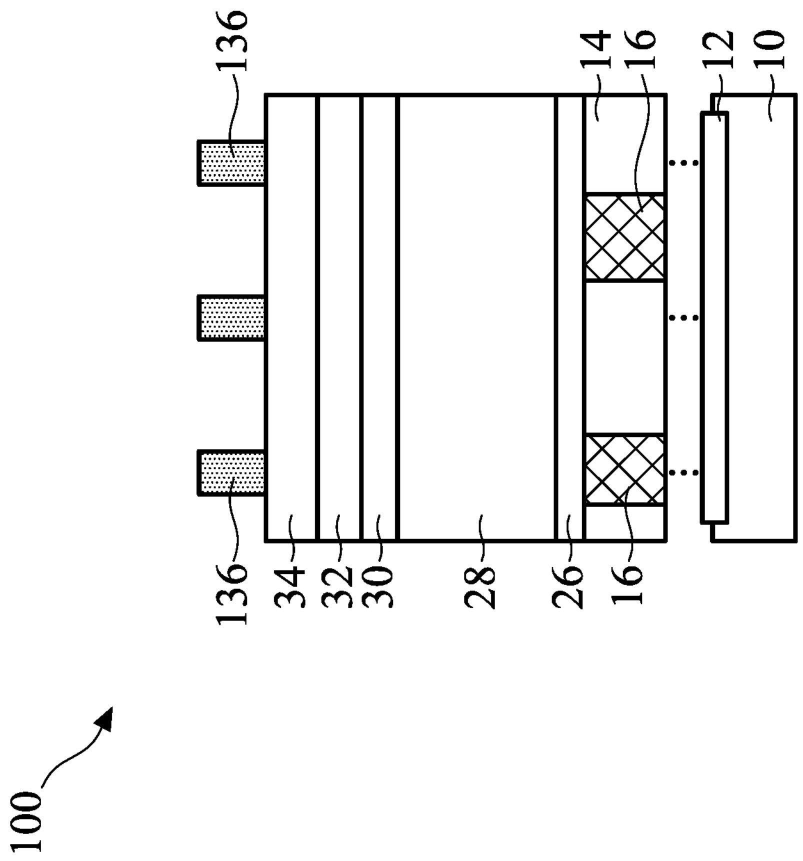

Next, top layer 142 is used as an etching mask to etch the underlying layer. FIG. 5 illustrates the cross-sectional view of an intermediate stage, in which middle layer 140 has been patterned. Next, bottom layer 38 is patterned using patterned layers 140 and 142 as an etching mask, and the remaining patterned tri-layer including layers 38, 140, and 142 are used as an etching mask to etch mandrel layer 36. The remaining portions of mandrel layer 36 are referred to as mandrels 136 (FIG. 6) hereinafter. The respective step is illustrated as step 214 in the process flow 200 shown in FIG. 21. The remaining portions of the tri-layer are then removed, and the resulting structure is shown in FIG. 6.

Figure 7:
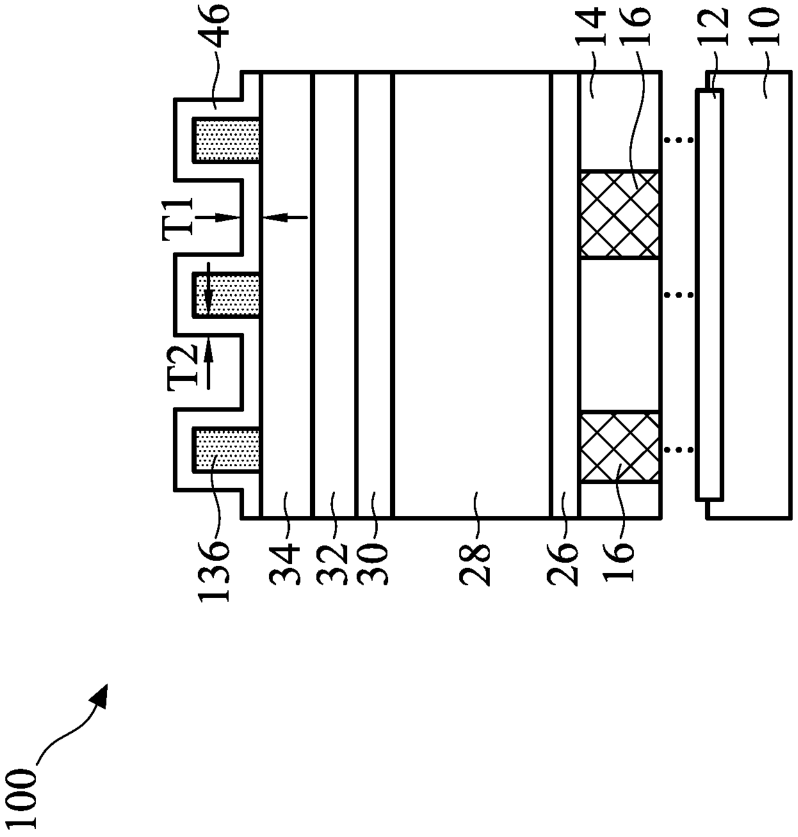
Figure 8:
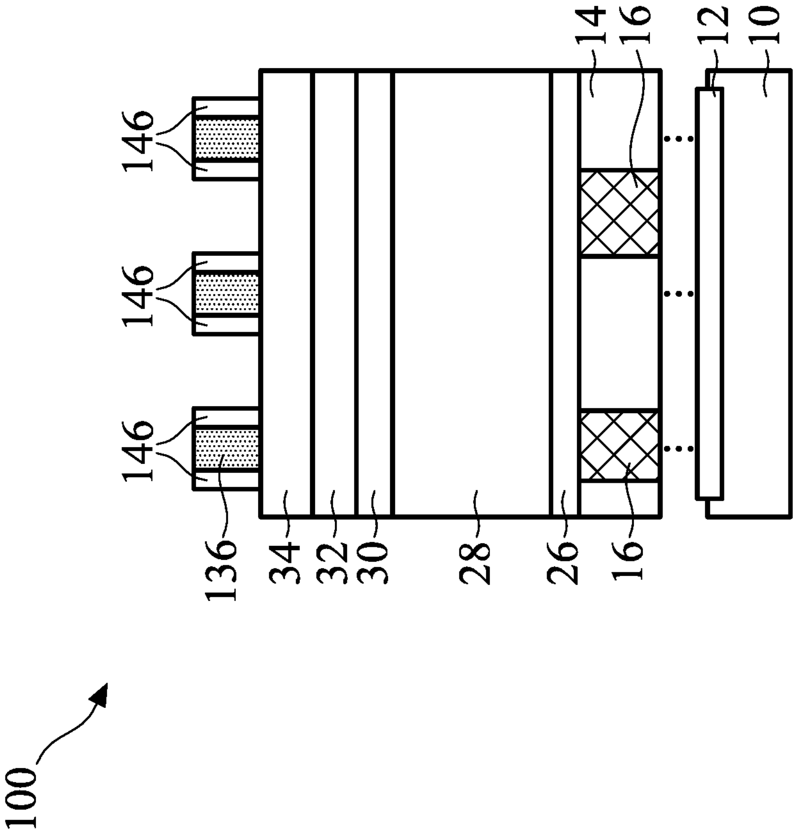
Figure 9:
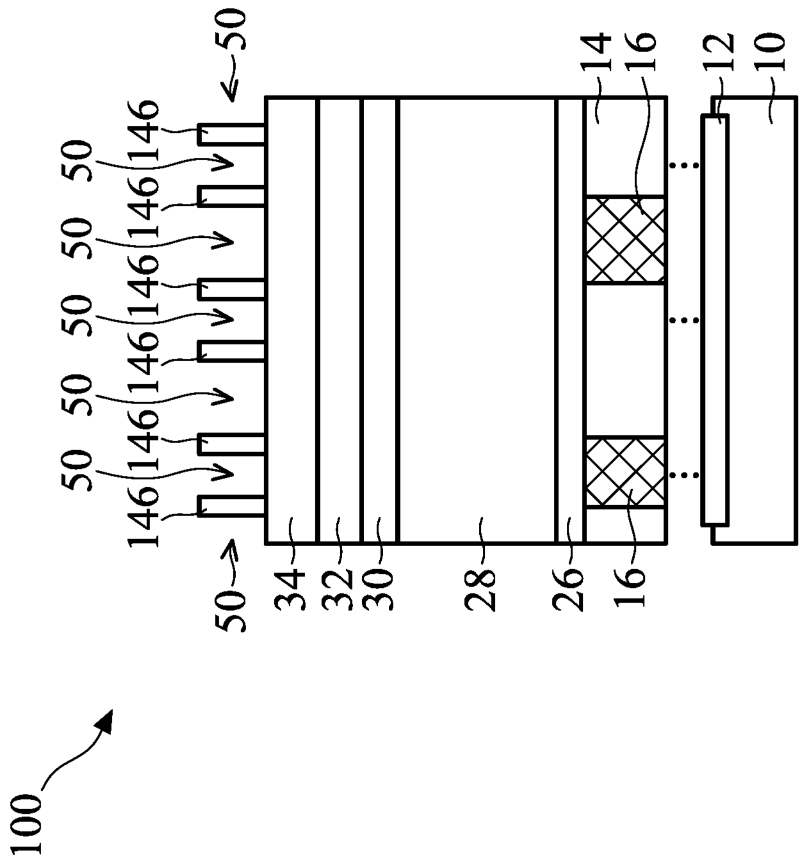

Referring to FIG. 7, spacer layer 46 is formed in accordance with some embodiments of the present disclosure. The respective step is illustrated as step 216 in the process flow 200 shown in FIG. 21. Spacer layer 46 is a conformal layer, with the thickness T1 of its horizontal portions and the thickness T2 of its vertical portions being close to each other, for example, with a difference between thicknesses T1 and T2 smaller than about 20 percent of thickness T1. An anisotropic etching is then performed to remove the horizontal portions of spacer layer 46, while the vertical portions of spacer layer 46 remain, and are referred to as spacers 146 hereinafter. The resulting structure is shown in FIG. 8. The respective step is illustrated as step 218 in the process flow 200 shown in FIG. 21. The resulting spacers 146 thus have a pitch equal to a half of the pitch of mandrels 136, and hence the corresponding process is referred to as a double-patterning process. Mandrels 136 are then removed, and the resulting structure is shown in FIG. 9. Openings 50 are thus formed between mandrels spacers 146.

In accordance with some embodiments of the present disclosure, spacers 146 are used as an etching mask to etch the underlying dielectric hard mask 34 and metal hard mask 32. The respective step is illustrated as step 220 in the process flow 200 shown in FIG. 21.

Figure 10:
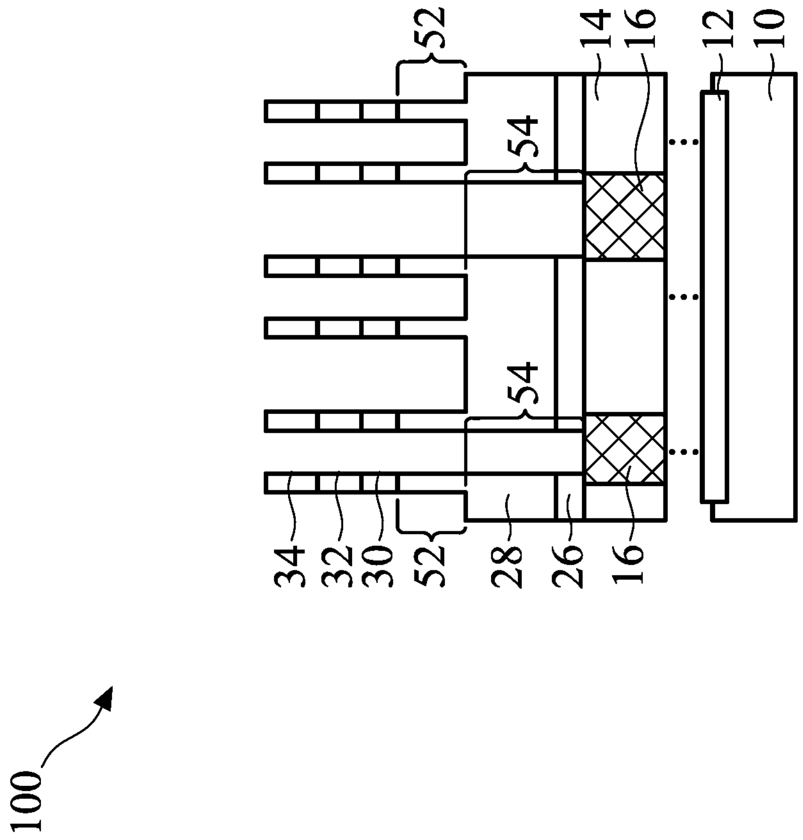

Next, dielectric hard mask 34 and metal hard mask 32 are used as an etching mask to etch hard mask 30. Spacers 146 may be consumed in this process. The resulting structure is shown in FIG. 10. In FIG. 10, the patterned hard mask 32 is also used as an etching mask to etch the underlying low-k dielectric layer 28 and etch stop layer 26, so that trenches 52 are formed. Additional process steps are also performed to define and etch low-k dielectric layer 28 to form via openings 54 underlying trenches 52. Although trenches 52 and via openings 54 have the same widths in the illustrated plane, in a vertical plane perpendicular to the illustrated plane, via openings 54 have smaller widths than trenches 52.

Figure 11:
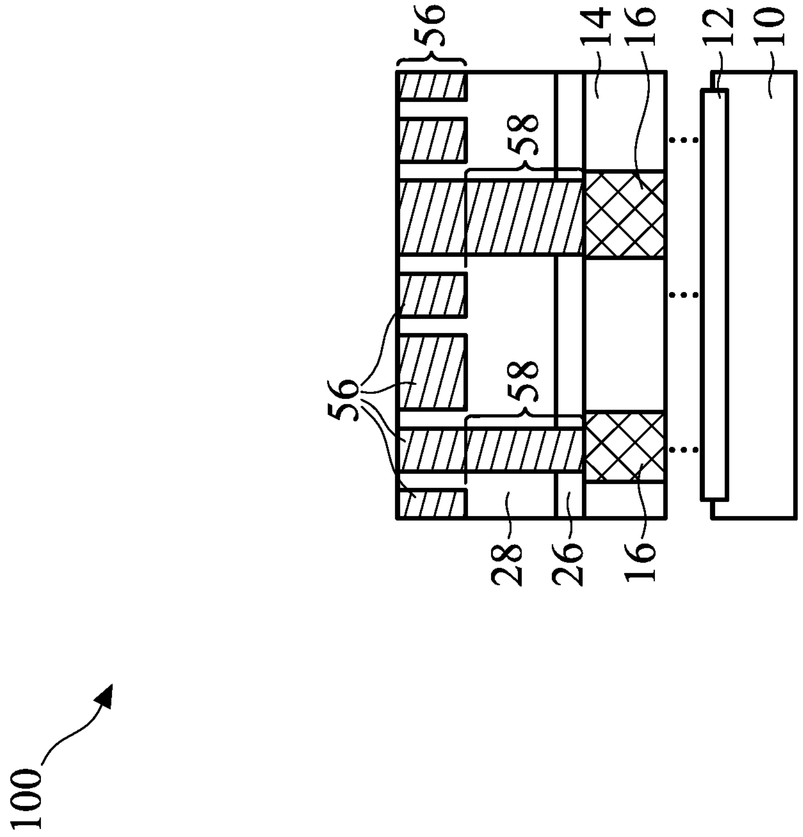

FIG. 11 illustrates the filling of trenches 52 and via openings 54 (FIG. 10) to form metal lines 56 and vias 58, respectively. The respective step is illustrated as step 222 in the process flow 200 shown in FIG. 21. In accordance with some embodiments of the present disclosure, the formation process includes a dual damascene process, wherein a conductive barrier layer such as titanium nitride, titanium, tantalum nitride, tantalum, or the like is formed on the sidewalls and the bottoms of trenches 52 and via openings 54. The remaining portions of trenches 52 and via openings 54 are then filled with a filling metal such as copper or a copper alloy. A Chemical Mechanical Polish (CMP) is then performed to remove excess portions of the barrier layer and the filling metal, forming metal lines 56 and vias 58 as shown in FIG. 11. Metal lines 56 and vias 58 are electrically connected to the underlying conductive features 16. In subsequent steps, an etch stop layer (not shown) is formed over dielectric layer 28 and metal lines 56, followed by the formation of another low-k dielectric layer, and the steps shown in FIGS. 1 through 11 may be repeated to form more metal lines and vias.

In accordance with some embodiments of the present disclosure, as illustrated above, target layer 28 is a dielectric layer, and the process steps of the present disclosure are used to form metal lines in the dielectric layer. In accordance with alternative embodiments of the present disclosure, target layer 28 is formed of a semiconductor material such as a semiconductor substrate. Accordingly, the process step shown in FIGS. 1 through 11 may be used to form trenches in target layer 28, and the trenches can be filled with a dielectric material to form Shallow Trench Isolation (STI) regions. In accordance with alternative embodiments of the present disclosure, the process steps in accordance with the embodiments of the present disclosure may be used to etch various features such as dielectric features, semiconductor features, or metal features to form dielectric lines, semiconductor lines, or metal lines.

The embodiments of the present disclosure have some advantageous features. By including quaternary ammonium hydroxide and/or quaternary ammonium fluoride in the chemical solution for etching the middle layer in a tri-layer, due to the steric hindrance of quaternary ammonium hydroxide and quaternary ammonium fluoride, the quaternary ammonium hydroxide and quaternary ammonium fluoride do not penetrate into the underlying bottom layer. Furthermore, the chemicals with small molecule weights are not used in the chemical solution, and hence in the rework of the tri-layer, no chemical adversely penetrates into the bottom layer. The adverse effect of these small-molecule weight chemicals to the subsequent rework is thus avoided. In addition, quaternary ammonium hydroxide and quaternary ammonium fluoride (especially the combination of quaternary ammonium hydroxide and quaternary ammonium fluoride) have high etching rates for etching the middle layer. Also, the etching selectivity (the ratio of the etching rate of the middle layer to the etching rate of the bottom layer) is high, hence the damage to the bottom layer is minimized, and the bottom layer can be reused. This significantly reduces the manufacturing cost.

In accordance with some embodiments of the present disclosure, a method includes forming a tri-layer, the tri-layer comprising: a bottom layer; a first middle layer over the bottom layer; and a first top layer over the first middle layer, wherein the first top layer comprises a photo resist; removing the first top layer; and removing the first middle layer using a chemical solution, wherein the chemical solution is free from KOH, and comprises at least one of a quaternary ammonium hydroxide and a quaternary ammonium fluoride. In an embodiment, the bottom layer remains after the removing the first middle layer, and the method further comprises: forming a second middle layer over and contacting the bottom layer; and forming a second top layer over the second middle layer, wherein the second top layer comprises an additional photo resist. In an embodiment, the method includes performing light exposures on the first top layer and the second top layer using lithography masks having identical patterns. In an embodiment, the chemical solution further comprises an organic solvent and water. In an embodiment, in the removing the first middle layer, an etching selectivity of an etching rate of the first middle layer to an etching rate of the bottom layer is greater than about 100. In an embodiment, before the removing the first top layer, performing a light exposure and a development on the first top layer. In an embodiment, the chemical solution comprises both the quaternary ammonium hydroxide and the quaternary ammonium fluoride. In an embodiment, the quaternary ammonium hydroxide comprises TMAH, and the quaternary ammonium fluoride comprises TMAF, and a ratio of a weight percentage of the TMAH to a weight percentage of the TMAF is close to about 1:3. In an embodiment, the chemical solution is further free from NaOH, $NH_4OH$, and HF.

In accordance with some embodiments of the present disclosure, a method includes forming a first middle layer over a bottom layer, wherein the first middle layer comprises siloxane; and etching the first middle layer, wherein the bottom layer remains as a blanket layer after the first middle layer is etched, and the etching the first middle layer is performed in a wet etching process using a chemical solution comprising: a quaternary ammonium hydroxide; a quaternary ammonium fluoride; an organic solvent; and water. In an embodiment, the method further includes, after the first middle layer is etched, forming a second middle layer comprising siloxane over the bottom layer; and patterning the second middle layer. In an embodiment, after the etching the first middle layer, substantially an entirety of the bottom layer remains. In an embodiment, the organic solvent is configured to stabilize silanol. In an embodiment, the organic solvent comprises ethylene glycol.

In accordance with some embodiments of the present disclosure, a chemical solution includes at least one of a quaternary ammonium hydroxide and a quaternary ammonium fluoride; an organic solvent; and water, wherein the chemical solution is free from KOH. In an embodiment, the chemical solution includes both the quaternary ammonium hydroxide and the quaternary ammonium fluoride. In an embodiment, the quaternary ammonium hydroxide comprises TMAH, and the quaternary ammonium fluoride comprises TMAF. In an embodiment, a ratio of a weight percentage of the TMAH to a weight percentage of the TMAF is close to about 1:3. In an embodiment, the chemical solution is free from NaOH, $NH_4OH$, and HF. In an embodiment, the organic solvent has a weight percentage in a range between about 10 percent and about 15 percent.

In accordance with some embodiments of the present disclosure, a method includes forming a bottom layer; forming a first middle layer over the bottom layer; forming a first top layer over the first middle layer; performing a light exposure and a development on the first top layer; removing the first top layer; removing an entirety of the first middle layer in a chemical solution, wherein the bottom layer remains after the first middle layer is removed; forming a second middle layer over the bottom layer; forming a second top layer; performing an additional light exposure and an additional development on the second top layer; and etching the second middle layer and the bottom layer using the second top layer as an etching mask. In an embodiment, the chemical solution comprises both a quaternary ammonium hydroxide and a quaternary ammonium fluoride. In an embodiment, the method includes transferring patterns in the second middle layer and the bottom layer into an underlying low-k dielectric layer. In an embodiment, the method includes forming metal lines in the underlying low-k dielectric layer, with the metal lines having patterns same as patterns formed in the second middle layer.

In accordance with some embodiments of the present disclosure, a chemical solution includes an alkali; a fluoride; an organic solvent, wherein the organic solvent is solvable in water; and water having a weight percentage greater than about 70 percent in the chemical solution. In an embodiment, the chemical solution is free from KOH, NaOH, $NH_4OH$, and HF. In an embodiment, the alkali comprises a quaternary ammonium hydroxide, and the fluoride comprises a quaternary ammonium fluoride. In an embodiment, the quaternary ammonium hydroxide comprises TMAH, and the quaternary ammonium fluoride comprises TMAF.

In accordance with some embodiments of the present disclosure, a chemical solution includes TMAH; TMAF, wherein a ratio of a weight percentage of the TMAH to a weight percentage of the TMAF is close to about 1:3; an organic solvent configured to stabilize silanol; and water. In an embodiment, the organic solvent has a weight percentage in a range between about 10 percent and about 15 percent.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming an etching mask, the etching mask comprising:
a lower layer, wherein the lower layer is formed of a cross-linked material;
a first middle layer over the lower layer; and
a first upper layer over the first middle layer;
performing a light-exposure process on the first upper layer using a first photo lithography mask to define patterns of the first upper layer;
after the light-exposure process, removing the first upper layer through a wet etching process;
removing the first middle layer;
after the first middle layer is removed, forming a second upper layer over the lower layer; and
transferring patterns in a second photo lithography mask into the second upper layer, wherein the second photo lithography mask has a same pattern as the first photo lithography mask.

2. The method of claim 1 further comprising transferring the patterns in the second photo lithography mask into the lower layer.

3. The method of claim 1, wherein the second photo lithography mask is the first photo lithography mask.

4. The method of claim 1 further comprising, after the first middle layer is removed, forming a second middle layer over the lower layer, wherein the second upper layer is formed over the second middle layer.

5. The method of claim 1, wherein at a time the first middle layer has been removed, the lower layer is a blanket layer.

6. The method of claim 1, wherein in the removing the first middle layer, an etching selectivity of a first etching rate of the first middle layer to a second etching rate of the lower layer is greater than about 100.

7. The method of claim 1, wherein the first middle layer is removed using a chemical solution that is free from potassium hydroxide (KOH), and the chemical solution comprises at least one of a quaternary ammonium hydroxide and a quaternary ammonium fluoride.

8. The method of claim 7, wherein the quaternary ammonium hydroxide comprises tetramethylammonium hydroxide (TMAH), and the quaternary ammonium fluoride comprises tetramethylammonium fluoride (TMAF).

9. The method of claim 1, wherein at a time after the first middle layer is removed and before the second upper layer is formed, a top surface of the lower layer is exposed.

10. The method of claim 1, wherein the lower layer is formed over a dielectric layer, and the method further comprises etching the dielectric layer, with patterns of the second upper layer being transferred into the dielectric layer.

11. The method of claim 10, wherein during a period of time starting from a first time point when the first upper layer is formed and ending at a second time point when the second upper layer starts to be formed, no etching process is performed on the dielectric layer.

12. A method comprising:

forming a first middle layer over a bottom layer, wherein the bottom layer comprises a cross-linked organic material;

forming a first photoresist over the first middle layer;

patterning the first photoresist using a first photo lithography mask;

removing the first photoresist and the first middle layer through wet etching processes, wherein at least a portion of the bottom layer remains after the first photoresist is removed;

after the first middle layer is removed, forming a second middle layer comprising siloxane over the bottom layer;

after the second middle layer is formed, forming a second photoresist over the portion of the bottom layer; and patterning the second photoresist, wherein the first photoresist and the second photoresist are patterned using photolithography masks that have a same pattern; and patterning the second middle layer using the patterned second photoresist as an etching mask.

13. The method of claim 12, wherein at a time after the first photoresist is removed, the bottom layer remains as a blanket layer.

14. The method of claim 12, wherein an entirety of the first photoresist is removed.

15. The method of claim 12, wherein the bottom layer comprises a homogeneous organic material that is cross-linked.

16. The method of claim 12, wherein the first middle layer is removed in a wet etching process using a chemical solution comprising:

a quaternary ammonium hydroxide;

a quaternary ammonium fluoride; and an organic solvent comprising ethylene glycol.

17. The method of claim 12 further comprising etching a dielectric layer underlying the bottom layer, with patterns of the second photoresist being transferred into the dielectric layer.

18. A method comprising:

forming a bottom layer;

forming a first top layer over the bottom layer;

performing a first light-exposure process and a first development process on the first top layer;

removing a plurality of layers over the bottom layer to reveal a top surface of the bottom layer, wherein the removing the plurality of layers over the bottom layer comprises removing the first top layer, and wherein the removing the plurality of layers over the bottom layer is performed using a wet etching chemical solution, and the wet etching chemical solution is free from potassium hydroxide (KOH), and the chemical solution comprises at least one of a quaternary ammonium hydroxide and a quaternary ammonium fluoride;

forming a second top layer over the bottom layer, wherein at a time the second top layer is formed, the bottom layer is a blanket layer; and performing a second light-exposure process and a second development process on the second top layer, wherein the first light-exposure process and the second light-exposure process are performed using photo lithography masks having an identical pattern.

19. The method of claim 18, wherein at a time after the first top layer is removed, the bottom layer is the blanket layer.

20. The method of claim 18 further comprising:

etching a dielectric layer underlying the bottom layer, with patterns of the second top layer being transferred into the dielectric layer; and filling openings in the bottom layer with a conductive material.

* * * * *